(12) United States Patent
Asano et al.

(10) Patent No.: US 7,541,607 B2
(45) Date of Patent: Jun. 2, 2009

(54) ELECTRICALLY REWRITABLE NON-VOLATILE MEMORY ELEMENT AND METHOD OF MANUFACTURING THE SAME

(75) Inventors: Isamu Asano, Tokyo (JP); Tyler A. Lowrey, Rochester Hills, MI (US)

(73) Assignee: Elpida Memory, Inc., Tokyo (JP)

( * ) Notice: Subject to any disclaimer, the term of this patent is extended or adjusted under 35 U.S.C. 154(b) by 353 days.

(21) Appl. No.: 11/264,091

(22) Filed: Nov. 2, 2005

(65) Prior Publication Data
US 2007/0097737 A1 May 3, 2007

(51) Int. Cl.
*H01L 29/02* (2006.01)
(52) U.S. Cl. .................. 257/2; 257/3; 257/4; 257/5; 438/102; 438/103
(58) Field of Classification Search ............... 257/275, 257/421, 1–5; 438/3, 102–103; 365/163
See application file for complete search history.

(56) References Cited

U.S. PATENT DOCUMENTS

| | | | | |
|---|---|---|---|---|
| 5,185,282 | A * | 2/1993 | Lee et al. ............... | 438/253 |
| 5,536,947 | A | 7/1996 | Klersy et al. | |
| 6,867,425 | B2 | 3/2005 | Wicker | |
| 2003/0047765 | A1* | 3/2003 | Campbell ............... | 257/298 |
| 2003/0082908 | A1 | 5/2003 | Lowrey | |
| 2004/0042316 | A1* | 3/2004 | Lee et al. ............... | 365/223 |
| 2004/0087074 | A1 | 5/2004 | Hwang et al. | |
| 2004/0113232 | A1* | 6/2004 | Johnson et al. ......... | 257/529 |
| 2004/0164290 | A1* | 8/2004 | Yi et al. ................. | 257/4 |
| 2005/0122771 | A1* | 6/2005 | Chen .................... | 365/163 |

FOREIGN PATENT DOCUMENTS

KR 10-2005-0060435 6/2005

OTHER PUBLICATIONS

Hwang, Y., et al. "Writing Current Reduction for High-density Phase-change RAM." 2003 IEEE.
Ha, Y., et al. "An Edge Contact Type Cell for Phase Change RAM Featuring Very Low Power Consumption." 2003 Symposium on VLSI Technology Digest of Technical Papers.
Chinese Office Action, with English Translation, issued in Chinese Patent Application No. CN 2006101439223 dated on Sep. 19, 2008.

* cited by examiner

*Primary Examiner*—Thanh V Pham
*Assistant Examiner*—Jami M Valentine
(74) *Attorney, Agent, or Firm*—McDermott Will & Emery LLP

(57) ABSTRACT

A non-volatile memory element includes a bottom electrode 12, a bit line 14 provided on the bottom electrode 12, and a recording layer 15 containing phase change material connected between the bottom electrode 12 and the bit line 14. In accordance with this invention, the bit line 14 is in contact with a growth initiation surface 15a of the recording layer 15. This structure can be obtained by forming the bit line 14 before the recording layer 15, resulting in a three-dimensional structure. This decreases the area of contact between the recording layer 15 and the bit line 14, decreasing heat dissipation to the bit line 14 without increasing the thickness of the recording layer 15. With this three-dimensional structure, moreover, there is no top electrode between the bit line 14 and the recording layer 15, keeping down the complexity of the fabrication process.

16 Claims, 13 Drawing Sheets

ELECTRICALLY REWRITABLE NON-VOLATILE MEMORY ELEMENT AND METHOD OF MANUFACTURING THE SAME

TECHNICAL FIELD

The present invention relates to an electrically rewritable non-volatile memory element and to a method of manufacturing the element. More specifically, the present invention relates to an electrically rewritable non-volatile memory element having a recording layer that includes phase change material, and to a method of manufacturing the element.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabyte. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data, and write and erase times are slow. These drawbacks make flash memory an unsuitable candidate for replacing DRAM in main memory applications. There are other non-volatile memory devices, such as magnetoresistive random access memory (MRAM) and ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless it is heated to a high temperature, so data is retained even when the power supply is switched off.

In order to efficiently heat phase change material using a write current, it is desirable to use a structure that does not readily allow diffuse of the heat generated by the write current. In one structure for achieving, the upper surface of a recording layer is covered with a top electrode having low thermal conductivity to cut down on heat dissipation to a bit line that has a large thermal capacity and high thermal conductivity. See U.S. Pat No. 5,536,947, "Writing Current Reduction for High-density Phase-change RAM," Y. N. Hwang, S. H. Lee, S. J. Ahn, S. Y. Lee, K. C. Ryoo, H. S. Hong, H. C. Koo, F. Yeung, J. H. Oh, H. J. Kim, W. C. Jeong, J. H. Park, H. Horii, Y. H. Ha, J. H. Yi, G. H. Hoh, G. T. Jeong, H. S. Jeong, and Kinam Kim," IEEE 2003, and "An Edge Contact Type Cell for Phase Change RAM Featuring Very Low Power Consumption, "Y. H. Ha, J. H. Yi, H. Horii, J. H. Park, S. H. Joo, S. O. Park, U-In Chung, and J. T. Moon, 2003 Symposium on VLSI Technology Digest of Technical Papers.

However, because in the structure described in above literary documents the planar recording layer is sandwiched between a top electrode and a bottom electrode, the thickness of the recording layer has to be greatly increased to provide a sufficient decrease in the dissipation of heat to the bit line. Increasing the thickness of the recording layer means it takes longer to form the layer, in addition to which it takes a stronger electric field to induce the phase change, especially the change from a high resistance state to a low resistance state. Since the voltage for inducing the phase change therefore has to be increased, so the structure is not one that is suitable for achieving low-voltage devices.

Thus, it is difficult to adequately raise heating efficiency with devices having a conventional structure. This makes it difficult to reduce write current, and also makes it difficult to speed up write operations.

SUMMARY OF THE INVENTION

It is therefore an object of the present invention to provide an improved electrically rewritable non-volatile memory element having a recording layer that contains phase change material, and a method for manufacturing the memory element.

Another object of the invention is to provide an electrically rewritable non-volatile memory element with high heating efficiency having a recording layer that contains phase change material, and a method for manufacturing the memory element.

The above and other objects of the present invention can be accomplished by a non-volatile memory element comprising a bottom electrode, a bit line provided on the bottom electrode, and a recording layer containing phase change material connected to the bottom electrode and the bit line, wherein the bit line is in contact with a growth initiation surface of the recording layer.

Thus, the memory element of this invention has a structure in which the bit line is in contact with the growth initiation surface of the recording layer. This structure can be obtained by forming the bit line before the recording layer, resulting in a three-dimensional structure unlike that of the prior art. This decreases the area of contact between the recording layer and the bit line, decreasing heat dissipation to the bit line without increasing the thickness of the recording layer. With this three-dimensional structure, moreover, there is no top electrode between the bit line and the recording layer, keeping down the complexity of the fabrication process.

The memory element may also include an interlayer insulation layer between the bottom electrode and the bit line, and preferably at least part of the recording layer is formed in a through-hole provided in the interlayer insulation layer. This makes it easier to implement the recording layer as a three-dimensional structure.

The growth initiation surface of the recording layer may be in contact with the growth termination surface of the bit line, or may be in contact with the etched surface of the bit line formed by patterning.

The memory element may also include an etching stopper provided on the bit line, and preferably the through-hole passes through the interlayer insulation layer, the bit line and the etching stopper. Covering the bit line with the etching stopper prevents the bit line being damaged when processing the recording layer.

The above and other objects of the present invention can also be accomplished by a non-volatile memory element comprising a bottom electrode, a bit line provided on the bottom electrode, and a recording layer containing phase change material connected to the bottom electrode and the bit line, wherein the bit line is in contact with at least one of a side surface and a bottom surface of the recording layer.

This structure, too, can be obtained by forming the bit line before the recording layer, resulting in a three-dimensional structure unlike that of the prior art, that decreases heat dissipation to the bit line. In this case too, there is no need for a top electrode between the bit line and the recording layer.

A method for manufacturing a non-volatile memory element according to the present invention comprising a first step for forming a bottom electrode, a second step for forming an interlayer insulation layer covering the bottom electrode, a third step for forming a bit line on the interlayer insulation layer, a fourth step for forming a through-hole in the interlayer insulation layer, and a fifth step for forming a recording layer containing phase change material in the through-hole in contact with the bottom electrode and the bit line.

In accordance with this aspect of the present invention, the bit line is formed before the recording layer, and the recording layer is formed in the through-hole, resulting in a three-dimensional structure having high heating efficiency.

As described above, an electrically rewritable non-volatile memory element having improved heating efficiency, and a method of manufacturing the element can be provided. Therefore, not only a write current can be decreased but also a writing speed can be enhanced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
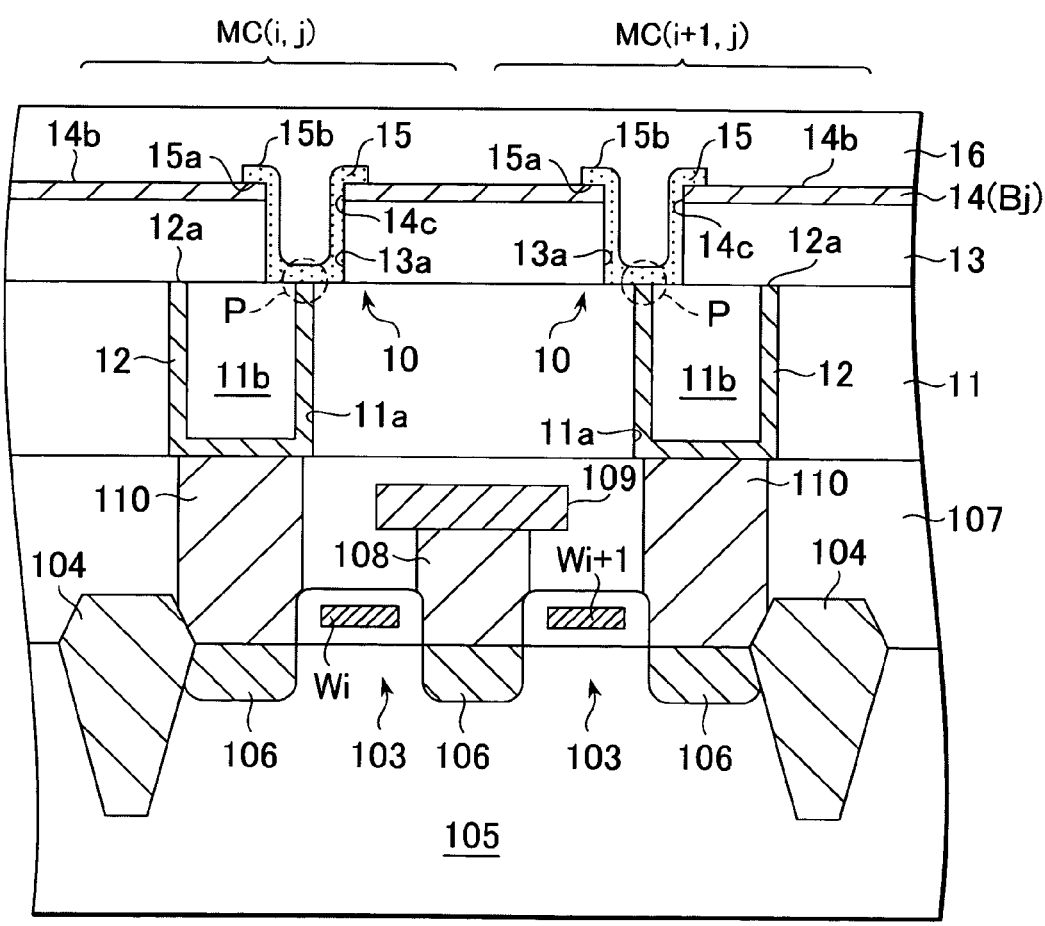
FIG. 1 is a cross-sectional view of the structure of a memory cell using the non-volatile memory element according to a first embodiment of the present invention.
Figure 2:
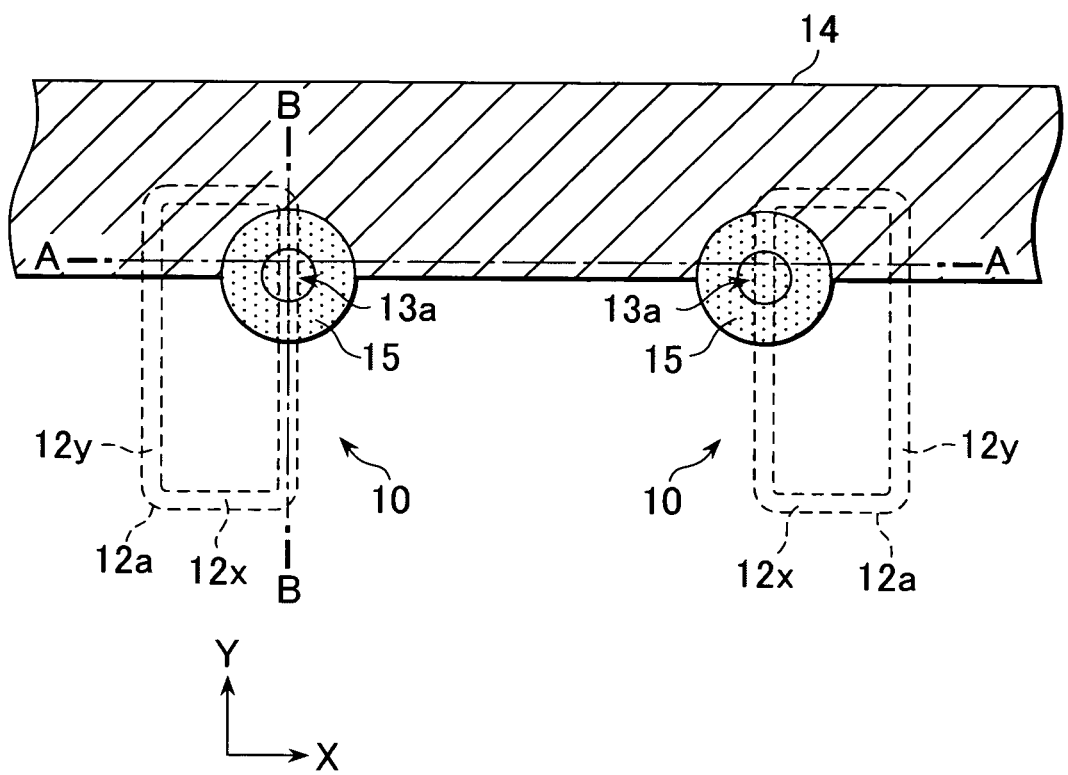
FIG. 2 is a plan view of the memory element according to a first embodiment of the present invention.
Figure 3:
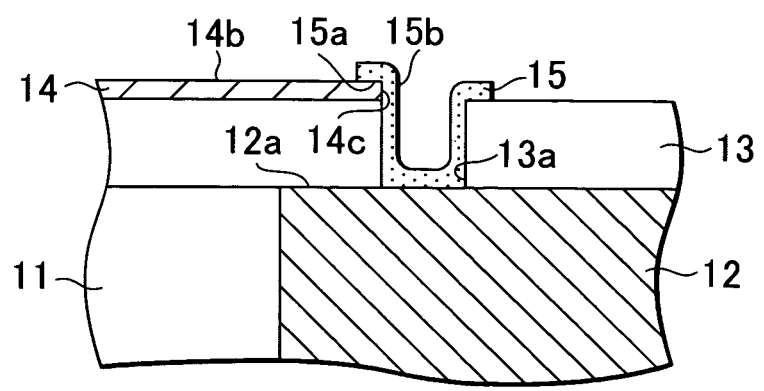
FIG. 3 is a cross-sectional view along the line B-B shown in FIG. 2.

FIG. 1 is a cross-sectional view of the structure of a memory cell using the non-volatile memory element 10 according to a first embodiment of the present invention. FIG. 2 is a plan view of the memory element 10. A cross-sectional view along the line A-A shown in FIG. 2 is shown in FIG. 1. FIG. 3 is a cross-sectional view along the line B-B shown in FIG. 2.

With reference to FIG. 1, the non-volatile memory element 10 according to this embodiment of the present invention, includes an interlayer insulation layer 11, a bottom electrode 12 buried in the interlayer insulation layer 11, an interlayer insulation layer 13 provided on the bottom electrode 12, a bit line 14 provided on the interlayer insulation layer 13, and a recording layer 15 in contact with the bottom electrode 12 and the bit line 14.

A material such as silicon oxide or silicon nitride may be used for the interlayer insulation layers 11 and 13. While it is not an essential requirement, it is preferable to form the interlayer insulation layers 11 and 13 using materials having different etching rates. For example, if the interlayer insulation layer 11 is formed of silicon nitride, it is preferable to use silicon oxide for the interlayer insulation layer 13. The bottom electrode 12 is formed in the shape of a cylinder around the inside wall of a through-hole 11a formed in the interlayer insulation layer 11. Thus, as shown in FIG. 2, the upper surface 12a of the bottom electrode 12 is ring-shaped. The region defined by the bottom electrode 12 is filled with insulation material 11b, which preferably is the same material as that of the interlayer insulation layer 11.

As shown in FIG. 2, the upper surface 12a of the bottom electrode 12 has a strip-shaped region 12x that extends in the X direction, and a strip-shaped region 12y that extends in the Y direction. In this embodiment, the strip-shaped region 12y is longer than the strip-shaped region 12x.

The bottom electrode 12 is used as a heater plug, constituting part of the heater during data writes. For this, the bottom electrode 12 is preferably formed of a material having a relatively high electrical resistance, such as metal silicides, metal nitrides and nitrides of metal silicides. These include, but are not limited to, TiAlN, TiSiN, TiCN and other such materials.

As shown in FIG. 1, the interlayer insulation layer 13 is provided between the bottom electrode 12 and the bit line 14. The interlayer insulation layer 13 has a through-hole 13a in which part of the recording layer 15 is formed. The through-hole 13a is provided at a location at which it exposes the strip-shaped region 12y, so that at the bottom part of the through-hole 13a, the recording layer 15 is in contact with the strip-shaped region 12y. The through-hole 13a is located in opposition to the strip-shaped region 12y to reduce variation in the area of contact between the recording layer 15 and the bottom electrode 12.

Figure 4A:
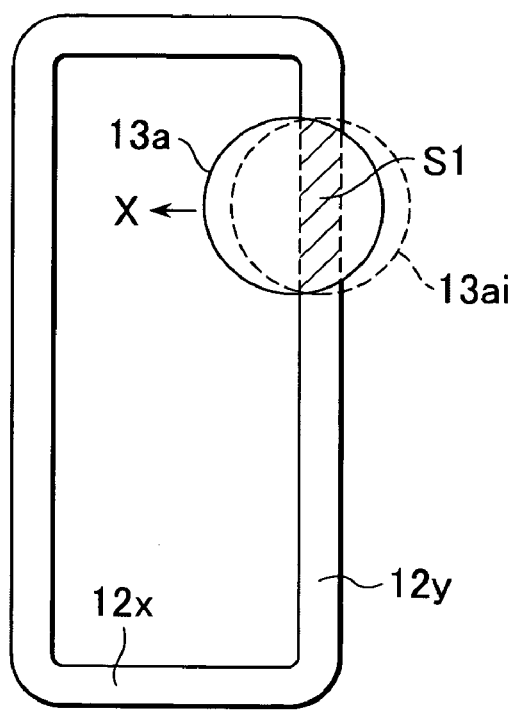
FIG. 4A is a drawing for explaining the effect produced by the position of the through-hole deviating in the X direction from the design position.
Figure 4B:
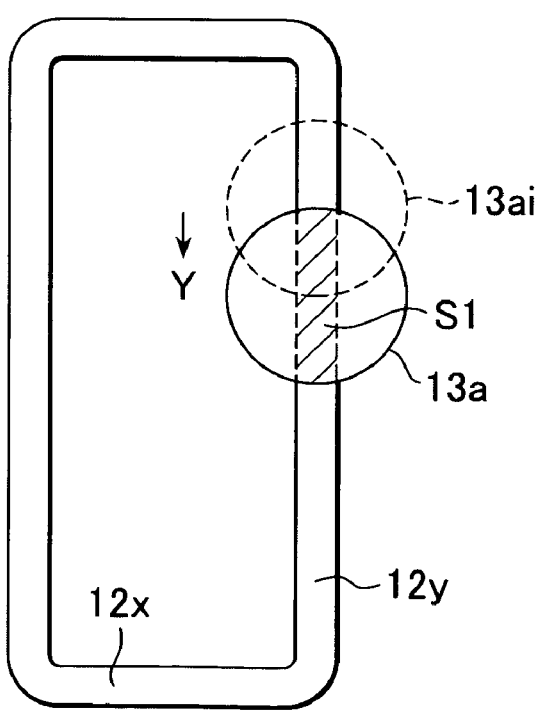
FIG. 4B is a drawing for explaining the effect produced by the position of the through-hole deviating in the Y direction from the design position.

Specifically, as shown in FIG. 4A, locating the through-hole 13a so that the strip-shaped region 12y is exposed makes it harder for variation to arise in the area S1 of the exposed strip-shaped region 12y, even if the actual location of the through-hole 13a deviates from the design position 13ai in the X direction, or in the Y direction, as shown in FIG. 4B. To a certain extent, the same effect is also obtained when the through-hole 13a is located in opposition to the strip-shaped region 12x. However, with respect to deviation, variation in the area S1 can be reduced more by locating the through-hole 13a in opposition to the longer strip-shaped region 12y.

The recording layer 15 is formed of phase change material. While the phase change material is not particularly limited and may be any material that takes two or more states and in which each state has a different electrical resistance, it is preferable to choose a chalcogenide material. Chalcogenide material means an alloy containing one or more elements such as germanium, antimony, tellurium, indium, and selenium. Examples include binary system alloys such as GaSb, InSb, InSe, $Sb_2Te_3$, and GeTe; ternary system alloys such as $Ge_2Sb_2Te_5$, InSbTe, GaSeTe, $SnSb_2Te_4$, and InSbGe; and quaternary system alloys such as AgInSbTe, (GeSn)SbTe, GeSb (SeTe), and $Te_{81}Ge_{15}Sb_2S_2$.

The phase change material containing the chalcogenide material can take an amorphous state or a crystalline state. In the amorphous state the resistance is relatively high, and in the crystalline state the resistance is relatively low.

Figure 5:
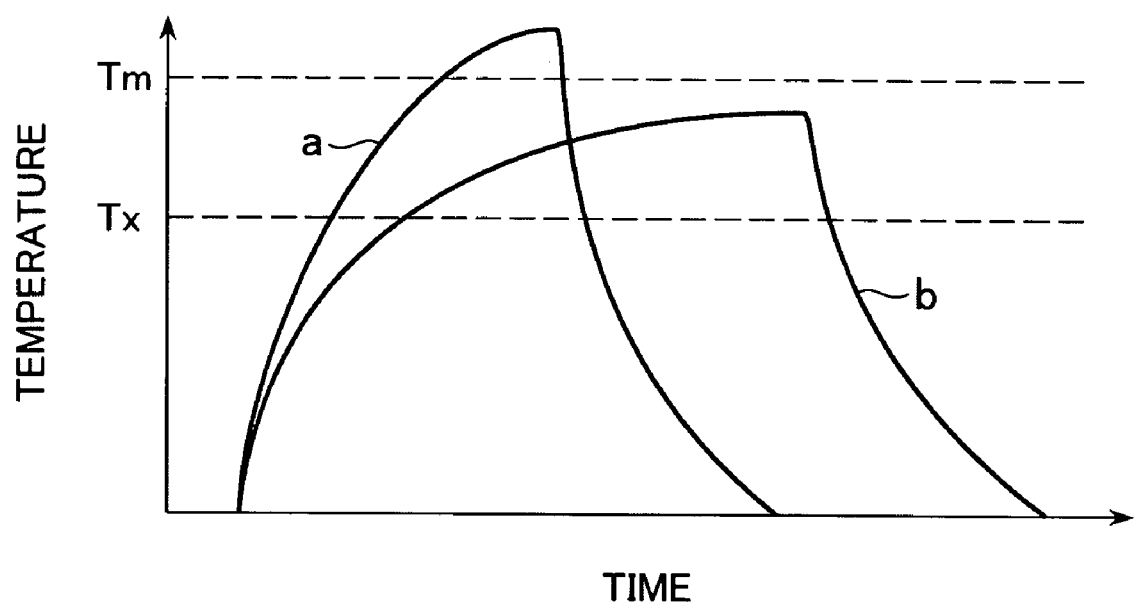
FIG. 5 is a graph for explaining the method of controlling the phase state of phase change material containing chalcogenide material.

FIG. 5 is a graph for explaining the method of controlling the phase state of phase change material containing chalcogenide material.

The phase change material is changed to the amorphous state by heating it to or above the melting temperature Tm and then cooling it, as shown by the curve a in FIG. 5. To change the material to the crystalline state, it is heated to a temperature that is at least as high as the crystallization temperature Tx and below the melting temperature Tm, as shown by curve b in FIG. 5. The heating temperature is controlled by controlling the duration and the amount of current per unit time that is passed through the material during the heating.

When the recording layer 15 is subjected to a write current, the region of contact between the recording layer 15 and the bottom electrode 12 becomes a heating region P. That is, the phase state of the chalcogenide material in the vicinity of the heating region P can be switched by applying a write current to the recording layer 15. Doing this changes the electrical resistance between the bit line 14 and the bottom electrode 12.

While there is no particular limitation on the thickness of the recording layer 15, in this embodiment, as one example, it is set at a thickness that does not completely fill the through-hole 13a. However, it may be set at a thickness that does completely fill the through-hole 13a. In this embodiment, in addition to being inside the through-hole 13a, a portion of the recording layer 15 is provided outside the through-hole 13a.

The bit line 14 is formed on the interlayer insulation layer 13, in contact with the growth initiation surface 15a of the recording layer 15. As shown in FIGS. 1 and 3, the growth initiation surface 15a of the part of the recording layer 15 that is located outside the through-hole 13a, is in contact with the growth termination surface 14b of the bit line 14. Also, the bit line 14 has an etched surface 14c formed by patterning, and this etched surface 14c is in contact with the growth initiation surface 15a on the side surface of the recording layer 15. That is, the side surfaces of the bit line 14 and recording layer 15 are in contact with each other.

For the bit line 14, a metallic material is chosen that has low electrical resistance. Examples include aluminum (Al), titanium (Ti), and tungsten (W), or alloys, nitrides or silicides thereof. Specific examples that can be cited include W, WN and TiN. Generally, a metallic material that has a low resistance has a high thermal conductivity, and also, since the bit line 14 has a large thermal capacity, contact with the recording layer 15 in the vicinity of the heating region P causes heat to readily diffuse to the bit line 14, degrading the heating efficiency. However, because in the case of the memory element 10 the recording layer 15 has a three-dimensional structure, it is possible to increase the distance between the heating region P and the bit line 14, without increasing the thickness of the recording layer 15.

An insulation layer 16 is provided on the bit line 14. All of the growth termination surface 15b of the recording layer 15 is covered by the insulation layer 16 (or by the protective insulation layer 17 described below).

The non-volatile memory element 10 thus constituted can be formed on a semiconductor substrate in the form of a matrix to constitute an electrically rewritable non-volatile memory device.

Figure 6:
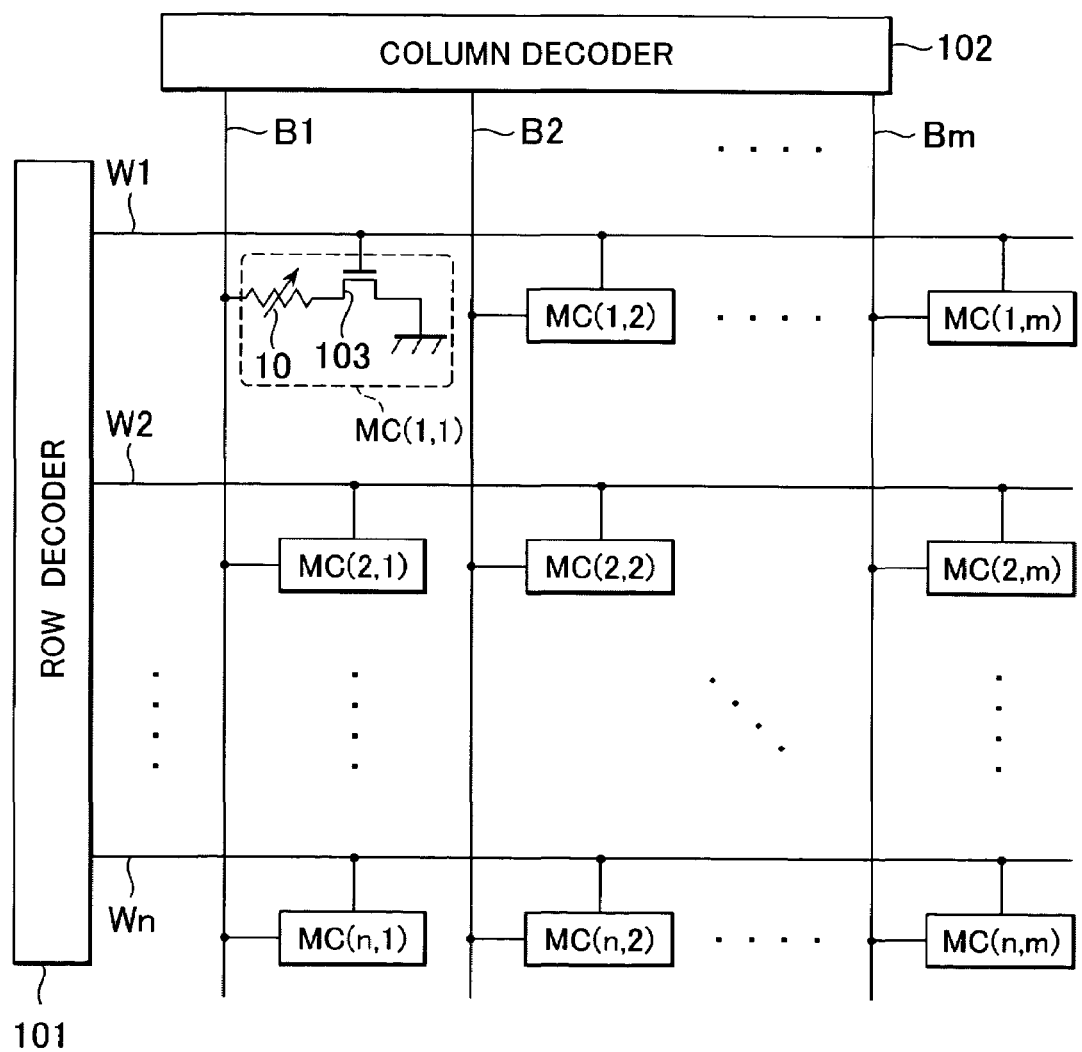
FIG. 6 is a circuit diagram of a non-volatile semiconductor memory device having a matrix configuration of n lines by m rows.

FIG. 6 is a circuit diagram of a non-volatile memory device configured as a matrix of n rows and m columns.

The non-volatile memory device shown in FIG. 6 has n word lines W1 to Wn, m bit lines B1 to Bm, and memory cells MC (1, 1) to MC (n, m), each located at an intersection of a word line and bit line. The word lines W1 to Wn are connected to a row decoder 101, and the bit lines B1 to Bm are connected to a column decoder 102. Each memory cell MC consists of a memory element 10 and transistor 103 connected in series between the corresponding bit line and ground. The control terminal of transistor 103 is connected to the corresponding word line.

The structure of the memory element 10 is as has been described with reference to FIG. 1. Thus, the bottom electrode 12 is connected to a corresponding transistor 103.

The structure of each of the memory cells MC used by the memory element 10 is as shown in FIG. 1, which shows two memory cells MC (i, j) and MC (i+1, j) sharing a common bit line Bj (14).

As shown in FIG. 1, word lines Wi and Wi+1 are connected to the gate electrode of the transistor 103. The active region 105, which is defined by element isolation regions 104, comprises three diffusion regions 106, whereby two transistors 103 are formed in a single active region 105. The two transistors 103 share a common source that is connected to the ground line 109 via a contact plug 108 in the interlayer insulation layer 107. The drain of each transistor 103 is connected to the bottom electrode 12 of the corresponding memory element 10 via a contact plug 110. The recording layer 15 of each of the two memory elements 10 is connected to a common bit line Bj.

In the non-volatile semiconductor memory device thus constituted, data reads and writes can be carried out by using the row decoder 101 to activate one of the word lines W1 to Wn, and then passing a current through at least one of the bit lines B1 to Bm. That is, the transistors 103 are switched on in the memory cells of the activated word line, connecting the corresponding bit lines to ground via the memory element 10. In this state, phase changes can be effected in the recording layer 15 by passing write current through the bit lines selected by the column decoder 102.

Specifically, when a prescribed amount of current is used to raise the temperature of the phase change material of the recording layer 15 to at least the melting temperature Tm, shown in FIG. 5, and the current is then abruptly switched off, the rapid cooling that ensures switches the material into the amorphous phase. When an amount of current that is less than the prescribed amount is used to heat the phase change material of the recording layer 15 to a temperature that is at least as high as the crystallization temperature Tx shown in FIG. 5 but lower than the melting temperature Tm, and the current is then gradually reduced, the gradual cooling thus produced promotes crystal growth, switching the material to the crystalline phase.

Data can be read by using the row decoder 101 to activate one of the word lines W1 to Wn and then passing a read current through at least one of the bit lines B1 to Bm. A memory cell MC in which the recording layer 15 is in the amorphous phase has a high resistance and a memory cell MC in which the recording layer 15 is in the crystalline phase has a low resistance, so the phase state of the recording layer 15 can be known by using a sense amplifier (not shown) to detect this.

Phase states of the recording layer 15 can be associated with stored logical values. If an amorphous phase state is defined as "0" and a crystalline phase state as "1", for example, one binary bit of information can be stored in a single memory cell. Also, when moving from the amorphous phase to the crystalline phase, the crystallization ratio can be controlled in multiple levels or linearly by adjusting the time the recording layer 15 is held at a temperature that is not lower than the crystallization temperature Tx and lower than the melting temperature Tm. With multilevel control of the ratio between the amorphous phase and the crystalline phase, two or more bits of data can be stored in a single memory cell, while with linear control, information can be stored as analog data.

The method of manufacturing the non-volatile memory element 10 will now be described.

Figure 7A:
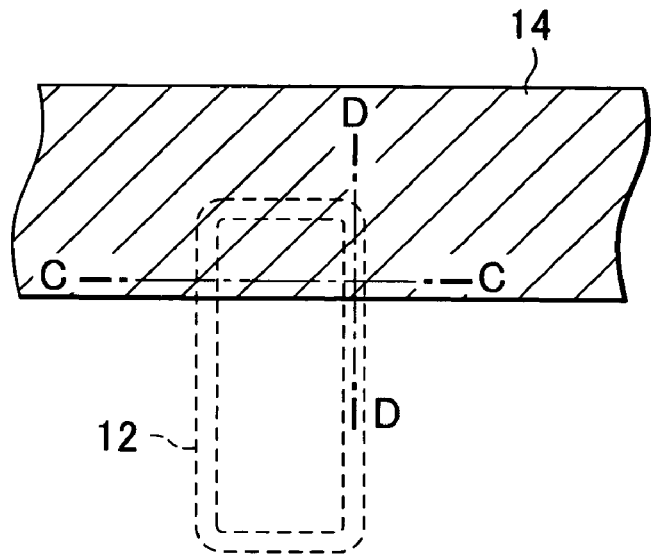
FIG. 7A is plan views illustrating the process of manufacturing the memory element according to a first embodiment of the present invention.
Figure 7B:
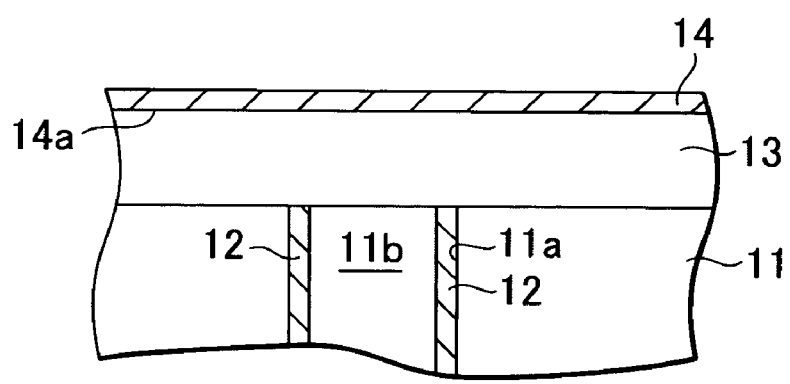
FIG. 7B is a cross-sectional view along the line C-C shown in FIG. 7A.
Figure 7C:
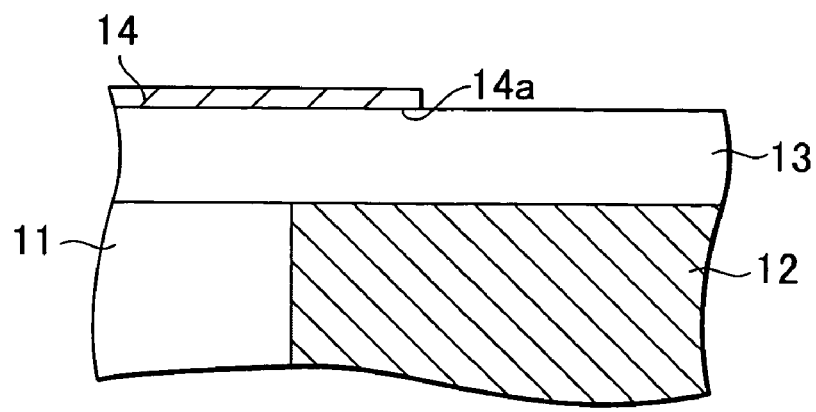
FIG. 7C is a cross-sectional view along the line D-D shown in FIG. 7A.
Figure 8A:
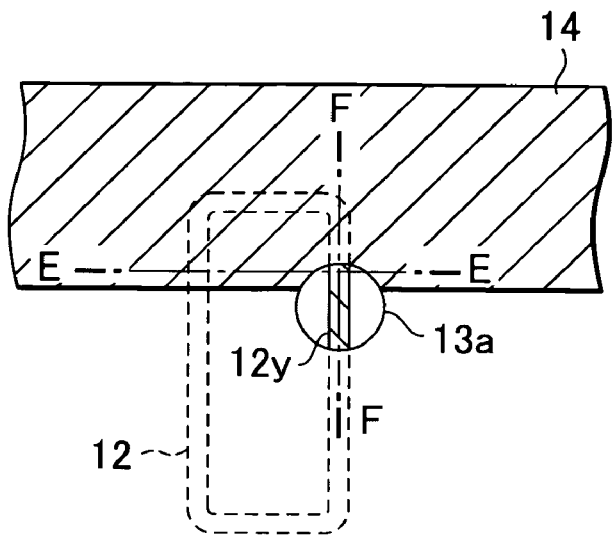
FIG. 8A is plan views illustrating the process of manufacturing the memory element according to a first embodiment of the present invention.
Figure 8B:
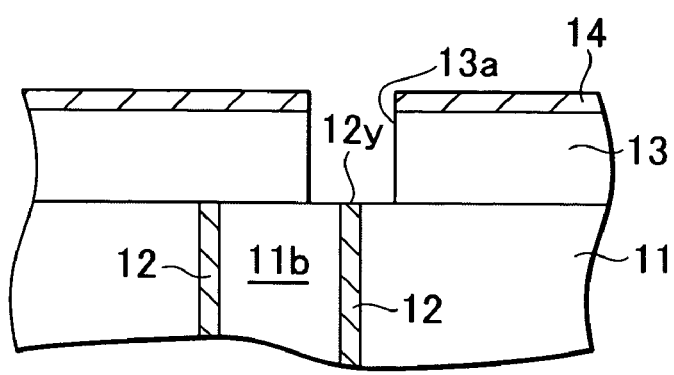
FIG. 8B is a cross-sectional view along the line E-E shown in FIG. 8A.
Figure 8C:
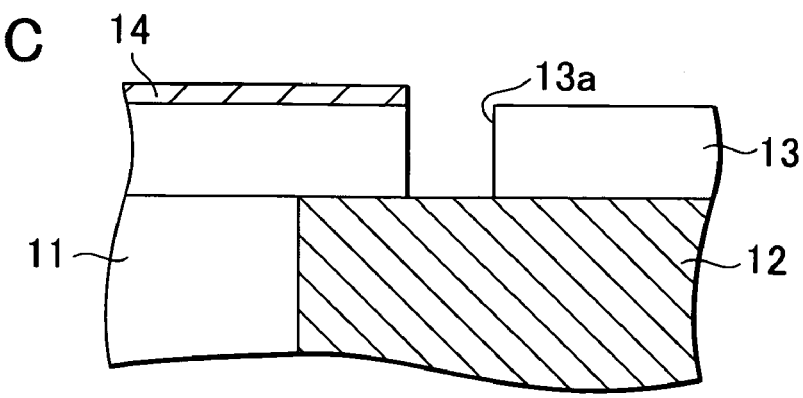
FIG. 8C is a cross-sectional view along the line F-F shown in FIG. 8A.

FIGS. 7A and 8A are plan views illustrating the process of manufacturing the memory element 10. FIGS. 7B and 7C are cross-sectional views along lines C-C and D-D, respectively, of FIG. 7A, and FIGS. 8B and 8C are cross-sectional views along lines E-E and F-F, respectively, of FIG. 8A. To facilitate understanding of the drawings, in each case the portion relating to transistor 103 has been omitted.

First, with reference to FIGS. 7A to 7C, after the cylindrical bottom electrode 12 is formed and the region thus defined is filled with the insulation material 11b, the interlayer insulation layer 13 and bit line 14 are formed, in that order. After the through-hole 11a has been formed in the interlayer insulation layer 11, a film growth method having good step coverage is used to form the bottom electrode 12 on the inside wall of the through-hole 11a, and the region thus defined by the bottom electrode 12 is filled with the insulation material 11b. Then, CMP is used to remove the portions of the insulation material 11b and bottom electrode 12 that are not required. CVD is a method providing good step coverage that can be used.

The bit line 14 is formed by forming the selected metallic material on the interlayer insulation layer 13, and then patterning it. As a result, growth initiation surface 14a of the bit line 14 is in contact with the whole of the interlayer insulation layer 13. As shown in FIG. 7A, viewed from above, preferably the bit line 14 is patterned so that the end part in the width direction intersects the strip-shaped region 12y of the bottom electrode 12.

Next, with reference to FIGS. 8A to 8C, the bit line 14 and interlayer insulation layer 13 are etched to form through-hole 13a, exposing a portion of the strip-shaped region 12y. The through-hole 13a can be formed using photolithography and dry etching. As shown in FIG. 8A, the through-hole 13a is formed at a position that includes an end part of the bit line 14 in the width direction. Over-etching of the interlayer insulation layer 11 and insulation material 11b occurring during the forming of the through-hole 13a can be reduced by using a material for the interlayer insulation layer 11 and insulation material 11b having a different etching rate from the material used for the interlayer insulation layer 13.

Next, as shown in FIGS. 1 to 3, after the recording layer 15, constituted by chalcogenide material, is formed over the whole surface, including inside the through-hole 13a, and patterning is used to remove the portion that is not required, the insulation layer 16 is formed over the whole surface, thereby completing the memory element 10. There is no particular limitation on the method used to form the recording layer 15. Sputtering or CVD, for example, may be used. In this way, by forming the bit line 14 before the recording layer 15, contact is effected between the growth termination surface 14b constituting the upper surface of the bit line 14, and the growth initiation surface 15a constituting the bottom surface of the recording layer 15.

Figure 9:
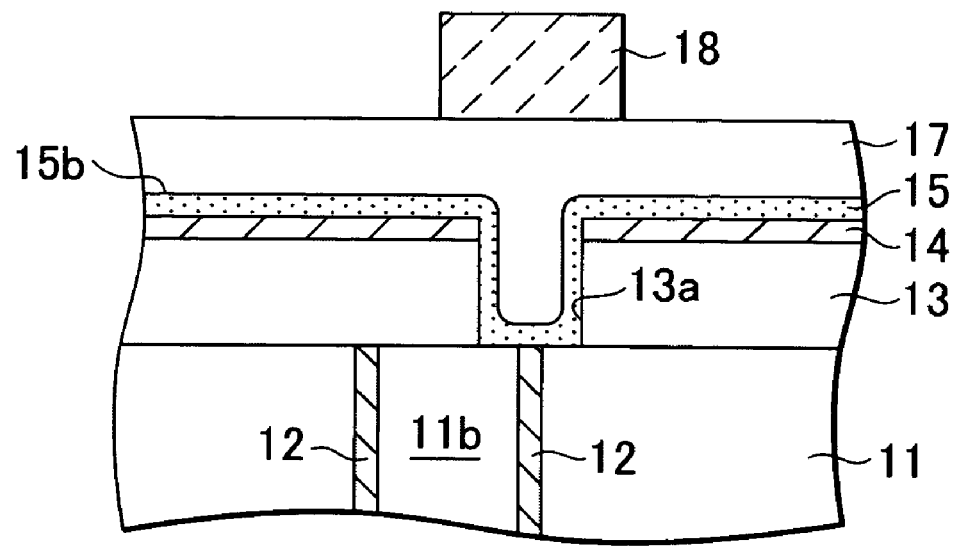
FIGS. 9 and 10 are drawings for explaining the method of patterning the recording layer via the protective insulation layer.
Figure 10:
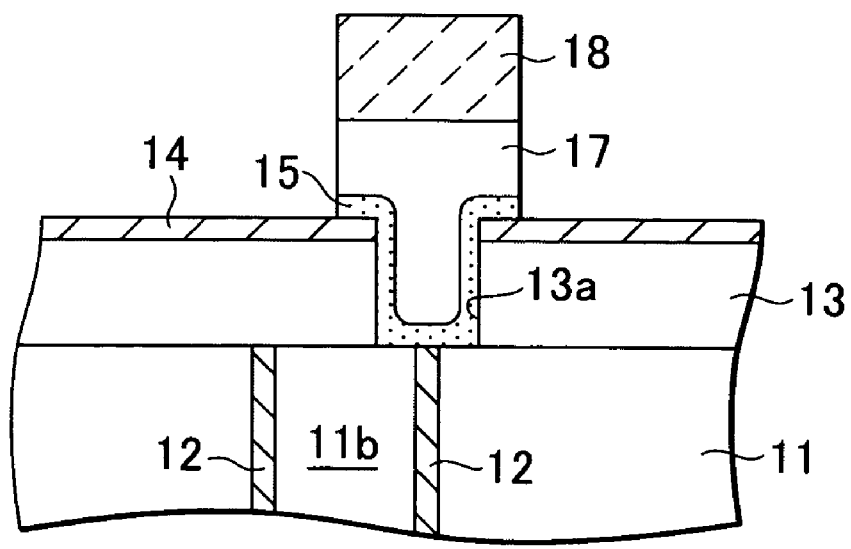

Preferably, as shown in FIG. 9, the patterning of the recording layer 15 is carried out with a protective insulation layer 17 formed over the whole of the upper surface (growth termination surface 15b) of the recording layer 15, and a photoresist 18 formed on the protective insulation layer 17. After completion of the patterning, as shown in FIG. 10, this makes it possible to protect the recording layer 15 from damage when ashing is used to remove the photoresist.

Thus, in accordance with this embodiment, the recording layer 15 formed on the inside wall of the through-hole 13a has a three-dimensional structure. Moreover, because the bit line 14 is formed before the recording layer 15, there is no forming of the bit line 14 in the through-hole 13a. As a result, the bit line 14 can be sufficiently distanced from the heating region P, and the contact area between the recording layer 15 and the bit line 14 can be reduced which, by decreasing heat dissipation to the bit line 14, results in higher heating efficiency. Furthermore, while a conventional configuration normally has a top electrode provided between the bit line 14 and the recording layer 15, the memory element of this embodiment does away with the top electrode, keeping down the complexity of the fabrication process.

In the case of the embodiment described in the foregoing, part of the bit line 14 is etched during the forming of the through-hole 13a. However, the through-hole 13a may instead be formed in a region where there is no bit line 14.

Figure 11:
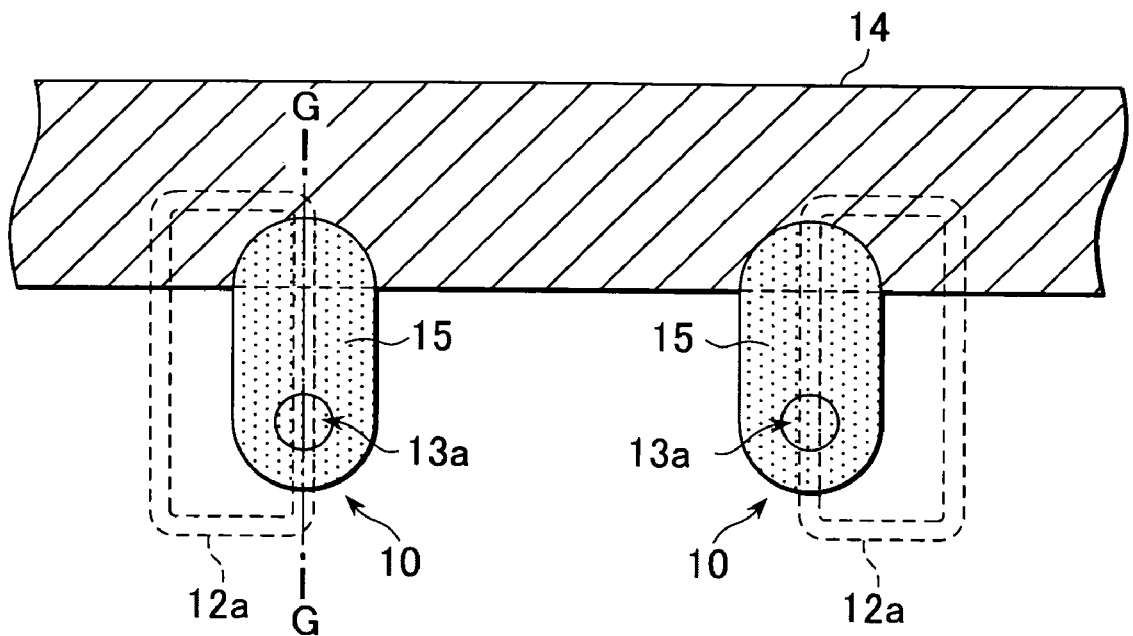
FIG. 11 is a plan view of an example of the memory element in which through-hole is formed in a region where there is no bit line.
Figure 12:
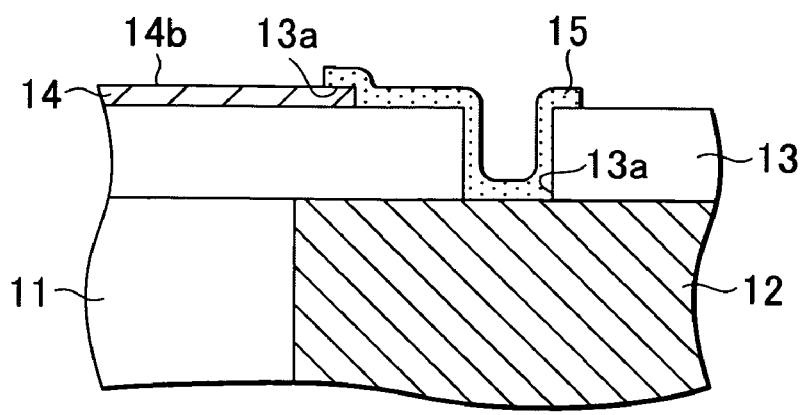
FIG. 12 is a cross-sectional view along the line G-G shown in FIG. 11.

FIG. 11 is a plan view of an example of the memory element in which through-hole is formed in a region where there is no bit line. FIG. 12 is a cross-sectional view along the line G-G shown in FIG. 11. As shown in FIGS. 11 and 12, when the through-hole 13a is formed in a region where there is no bit line 14, the size of the recording layer 15 may be increased to cover part of the bit line 14. In this case too, contact can be effected between the growth termination surface 14b and the growth initiation surface 15a.

With this configuration, the distance between the bit line 14 and the heating region P can be increased. However, if the through-hole 13a is too far from the bit line 14, heating efficiency is decreased by the increased volume of the recording layer 15 and power loss from the lower voltage. As such, these factors have to be taken into account when deciding where to locate the through-hole 13a.

Figure 13:
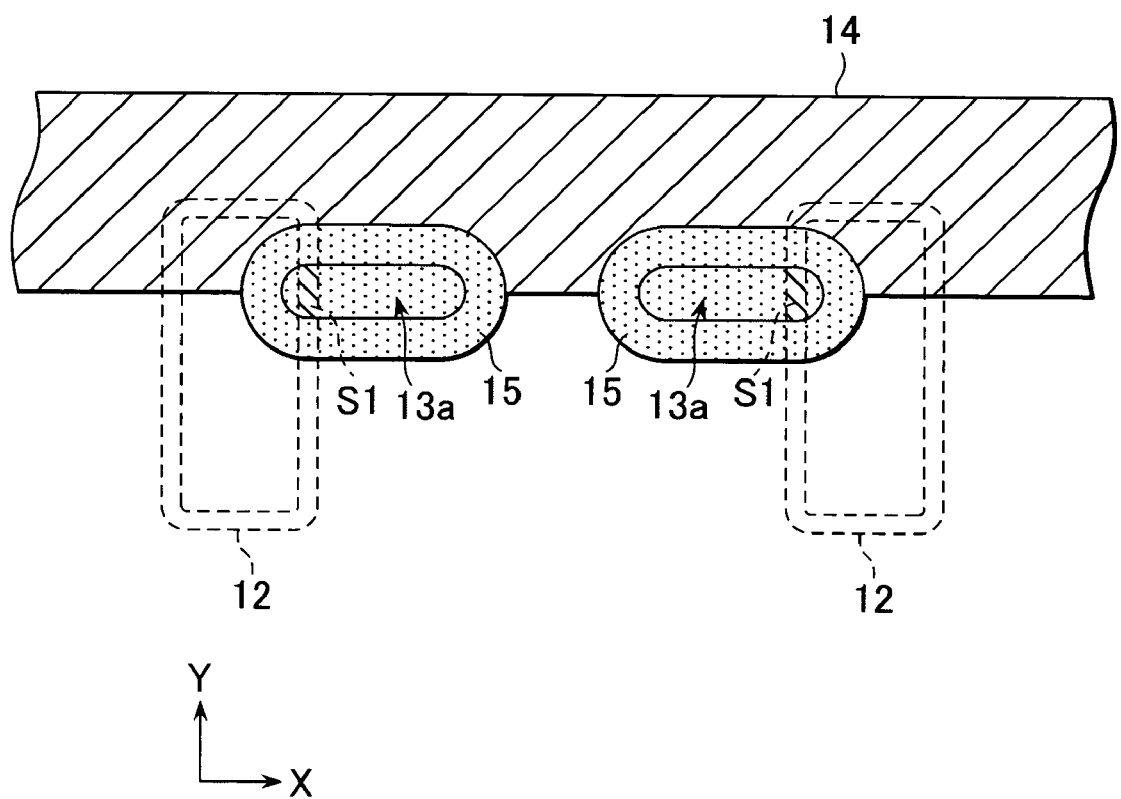
FIG. 13 is a plan view of an example of the memory element in which the planar shape of the through-hole and the recording layer is elongated in the X direction.

Also, in the foregoing embodiment the plane shape of the through-hole 13a and of the recording layer 15 is substantially circular, the through-hole 13a may have a shape that is elongated in the X direction along which the bit line 14 extends, as shown in FIG. 13, and the recording layer 15 may also be elongated in said X direction.

If, as shown in FIG. 13, through-hole 13a is elongated in the X direction, the margin in the X direction can be increased without increasing the contact area S1 between the recording layer 15 and the bottom electrode 12. Elongating the recording layer 15 in the X direction makes it possible to increase the margin in the Y direction when patterning the recording layer 15.

Figure 14A:
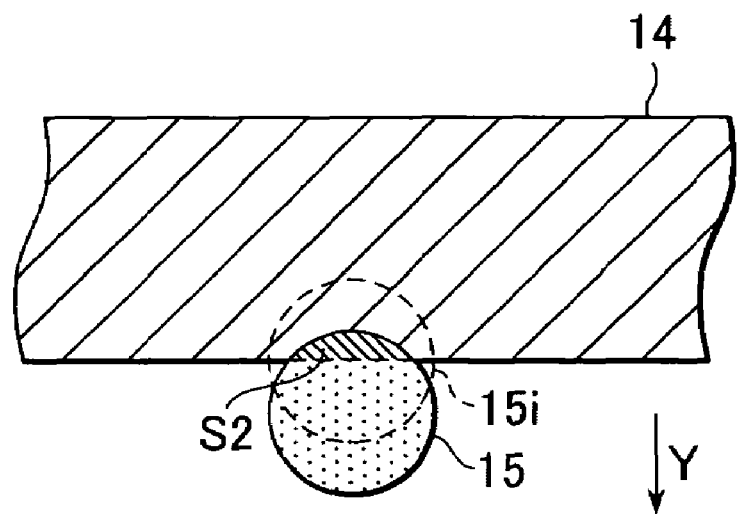
FIG. 14A is a drawing for explaining the effect produced by the position of the substantially circular recording layer deviating in the Y direction from the design position.
Figure 14B:
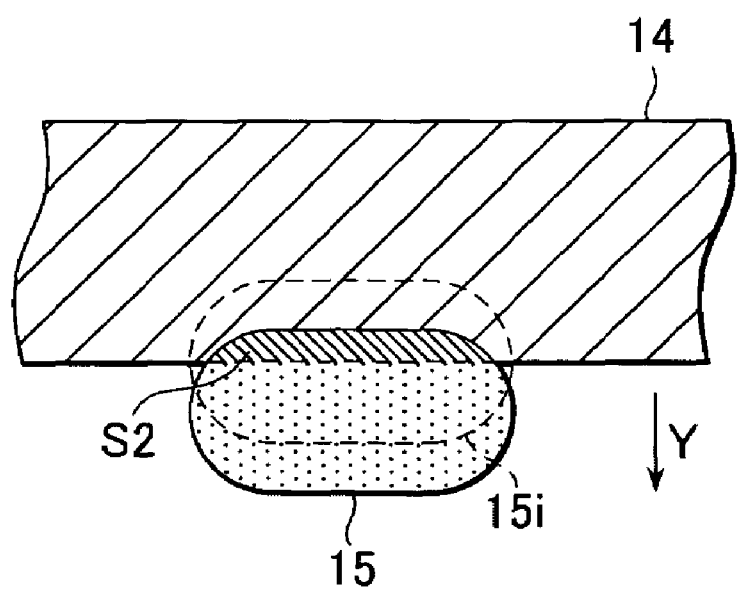
FIG. 14B is a drawing for explaining the effect produced by the position of the recording layer elongated in the X direction deviating in the Y direction from the design position.

Specifically, when the plane shape of the recording layer 15 is substantially circular, as in FIG. 14A, and the plane position of the recording layer 15 deviates from design position 15i in the Y direction, contact between the recording layer 15 and bit line 14 becomes more or less a point contact, considerably reducing the contact area S2. In contrast, when the plane shape of the recording layer 15 is elongated in the X direction, which is the same direction in which the bit line 14 extends, and as shown in FIG. 14B the plane position of the recording layer 15 deviates from the design position 15i in the Y direction, the contact area S2 between the recording layer 15 and the bit line 14 can be ensured to a certain degree. When patterning the recording layer 15, this increases the margin in the Y direction.

However, if the recording layer 15 is elongated too much in the X direction, the heat diffusion property is increased due to the increase in the contact area S2, and the volume of the recording layer 15 is increased, decreasing the heating efficiency. Therefore, this has to be taken into account when deciding the shape of the recording layer 15.

A non-volatile memory element 20 according to a second embodiment of the present invention will now be described.

Figure 15:
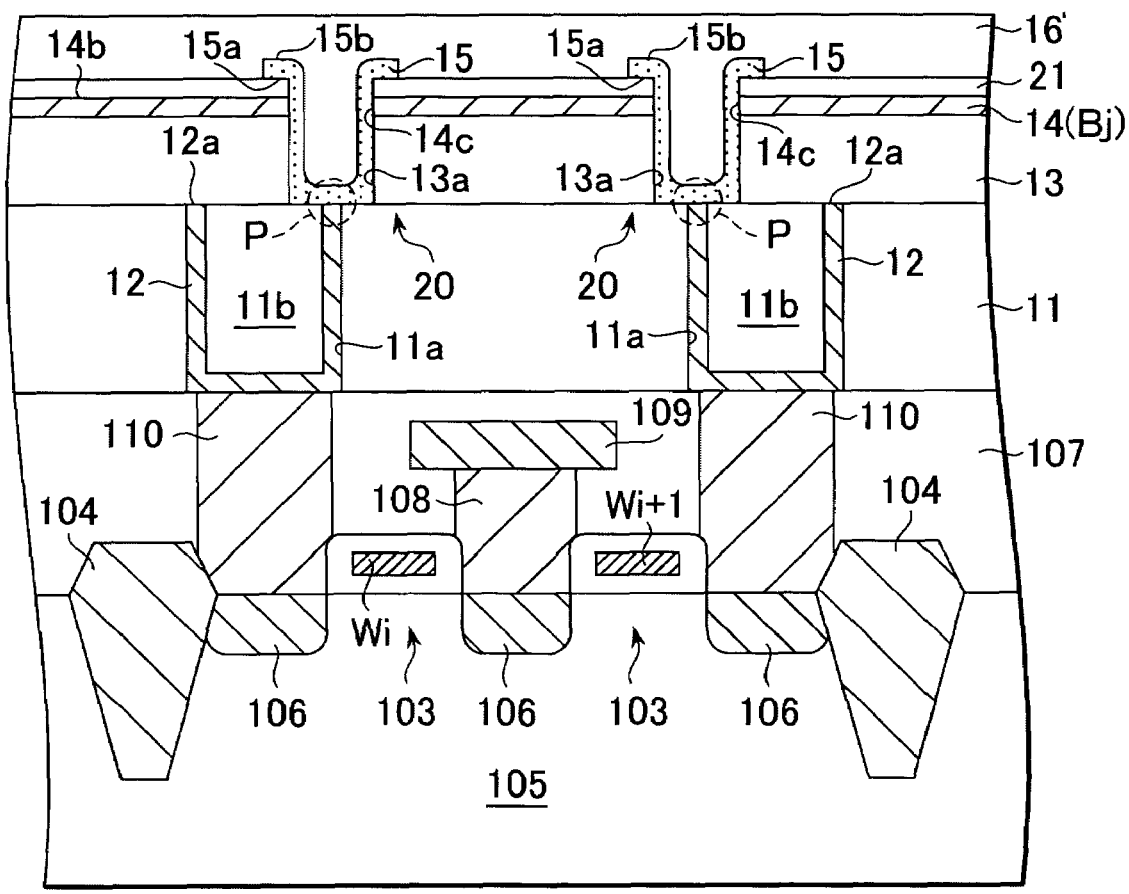
FIG. 15 is a cross-sectional view of the structure of a memory cell using the non-volatile memory element according to a second embodiment of the present invention.

FIG. 15 is a cross-sectional view of the structure of a memory cell using the non-volatile memory element 20 of this embodiment.

The difference between the memory element 20 and the memory element 10 of the first embodiment is that the memory element 20 has an etching stopper 21 on the bit line 14, and the through-hole 13a passes through the etching stopper 21, the bit line 14 and the interlayer insulation layer 13. Other parts and elements are the same and are denoted by the same symbols, so further explanation thereof is omitted.

The etching stopper 21 covers the whole of the upper surface (growth termination surface 14b) of the bit line 14, and functions as an etching stop when the recording layer 15 is being patterned. The bit line 14 is therefore not exposed to the etching atmosphere, which, by preventing the bit line 14 from being decreased in thickness, ensures the bit line has the prescribed resistance.

In this embodiment, contact between the bit line 14 and the recording layer 15 only takes place in the through-hole 13a. More specifically, the recording layer 15 only contacts the etched surface 14c formed by patterning. The contact area between the bit line 14 and recording layer 15 is therefore reduced, further decreasing heat dissipation to the bit line 14.

Instead of patterning the recording layer 15, the whole surface may be etched back to leave just the portion of the recording layer 15 that is on the inside wall of the through-hole 13a.

Figure 16A:
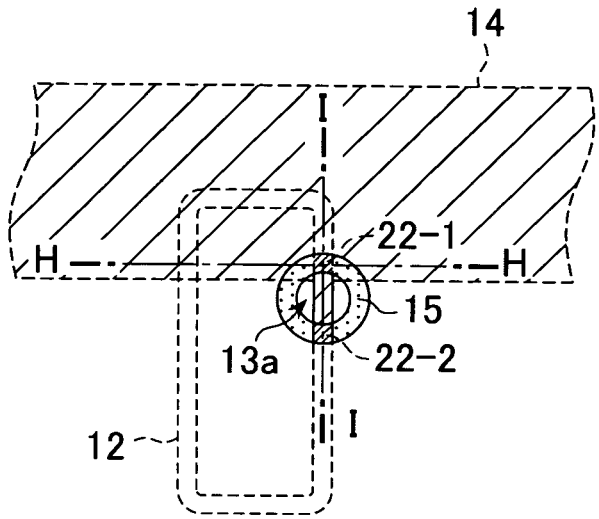
FIG. 16A is a plan view of an example of the memory element in which all that is left of the recording layer is the portion on the inside wall of the through-hole.
Figure 16B:
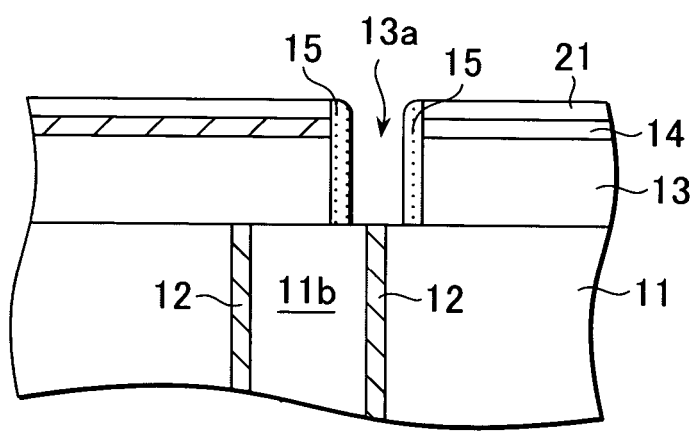
FIG. 16B is a cross-sectional view along the line H-H shown in FIG. 16A.
Figure 16C:
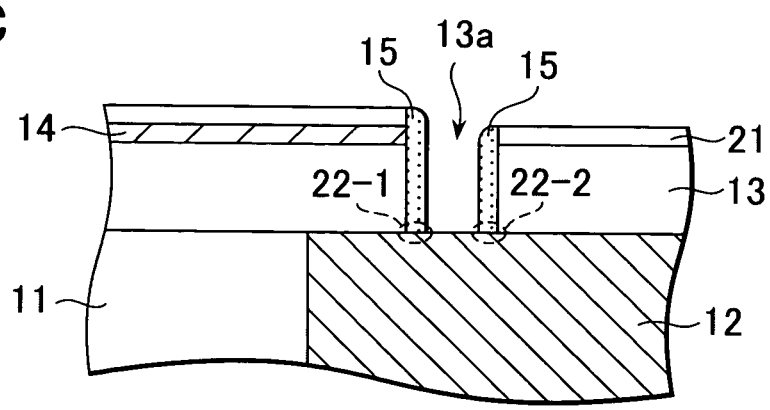
FIG. 16C is a cross-sectional view along the line I-I shown in FIG. 16A.

FIG. 16A is a plan view of an example in which only the part of the recording layer 15 on the inside wall of the through-hole 13a is left. FIGS. 16B and 16C are cross-sectional views along lines H-H and I-I, respectively, shown in FIG. 16A.

As shown in FIGS. 16A to 16C, etching the whole surface of the recording layer 15, so that even the portion at the bottom of the through-hole 13a is removed, gives the recording layer 15 a ring-shaped lower surface. This increases the heating efficiency by reducing the contact area between the recording layer 15 and the bottom electrode 12. Also, although there are two contact points between the recording layer 15 and the bottom electrode 12, forming two current conduction paths in the recording layer 15, contact region 22-1 is so much closer to the bit line 14 than contact region 22-2 that the current flowing via the contact region 22-2 can be considered negligible.

The provision of the etching stopper 21 on the bit line 14 prevents the bit line 14 being damaged when the recording layer 15 is being etched.

The present invention is in no way limited to the aforementioned embodiments, but rather various modifications are possible within the scope of the invention as recited in the claims, and naturally these modifications are included within the scope of the invention.

What is claimed is:

1. A non-volatile memory element, comprising:
   a bottom electrode;
   a bit line provided on the bottom electrode; and
   a recording layer containing phase change material arranged in a hole in an insulating layer, and connected between the bottom electrode and the bit line, the recording layer having a bottom surface contacting the bottom electrode, an upper surface opposite to the bottom surface, and a side surface facing an inner wall of the hole, and wherein the bit line is physically in direct contact with at least one of the side surface and the bottom surface of the recording layer.

2. The non-volatile memory element as claimed in claim 1, wherein a growth termination surface of the recording layer is substantially entirely covered with an insulation layer.

3. The non-volatile memory element as claimed in claim 1, further comprising an interlayer insulation layer located between the bottom electrode and the bit line, at least part of the recording layer being formed in a through-hole formed in the interlayer insulation layer.

4. The non-volatile memory element as claimed in claim 3, wherein an upper surface of the bottom electrode is ring-shaped.

5. The non-volatile memory. element as claimed in claim 4, wherein the upper surface of the bottom electrode includes a first strip-shaped. region extending in a first direction and a second strip-shaped region extending in a second direction substantially orthogonally to the first direction and being shorter than the first strip-shaped region, and the through-hole is disposed at a location that exposes the first strip-shaped region.

6. The non-volatile memory element as claimed in claim 5, wherein a diameter of the through-hole in the first direction is smaller than a diameter of the through-hole in the second direction.

7. The non-volatile memory element as claimed in claim 1, wherein the recording layer has an upper surface in which a length thereof in a direction that is orthogonal to a direction in which the bit line extends is shorter than a length thereof in the direction in which the bit line extends.

8. The non-volatile memory element as claimed in claim 4, wherein the bottom surface of the recording layer is ring-shaped, and the upper surface of the bottom electrode and the bottom surface of the recording layer are in contact at two points.

9. The non-volatile memory element as claimed in claim 3, wherein an upper surface of the bit line and the bottom surface of the recording layer are physically in direct contact with each other.

10. The non-volatile memory element as claimed in claim 3, wherein the bit line has a side surface, and said side surface and the bottom surface of the recording layer are physically in direct contact with each other.

11. The non-volatile memory element as claimed in claim 10, further comprising a etching stopper provided on the bit line, wherein the through-hole passes through the interlayer insulation layer, the bit line and the etching stopper.

12. The non-volatile memory element as claimed in claim 1, further comprising switching means connected to the bottom electrode, said switching means switching in response to a signal on a word line.

13. The non-volatile memory element as claimed in claim 1, wherein the recording layer is physically in direct contact with at least one of an upper surface and a side surface of the bit line.

14. A semiconductor memory device having a memory element connected between a bit line and a bottom electrode, the memory element comprising:

an insulating layer having an upper surface;

a hole selectively formed in the insulating layer, the insulating layer thereby further having a side surface defining a part of the hole;

a first conductive layer functioning as the bit line formed on the upper surface of the insulating layer, the first conductive layer having an upper surface and a side surface which is substantially aligned with the side surface of the insulating layer such that the side surface of the first conductive layer and the side surface of the insulating layer are arranged to be a single surface;

a phase change recording layer formed on the side surface of the first conductive layer and elongated over the side surface of the insulating layer to provide an elongated portion; and a second conductive layer functioning as the bottom electrode formed in contact with the elongated portion of the phase change recording layer.

15. The device as claimed in claim 14, wherein the insulating layer is a first insulating layer and the memory element further comprises a second insulating layer on which the first insulating layer is formed, the second conductive layer being embedded in the second insulating layer, the contact hole exposing respective parts of the second insulating layer and the second conductive layer, and the elongated portion of the phase change recording layer covering the respective parts of the second insulating layer and the second conductive layer.

16. The device as claimed in claim 14, wherein the phase change recording layer is further elongated over a part of the upper surface of the first conductive layer in contact therewith.

\* \* \* \* \*